US007684257B1

(12) United States Patent
Lee et al.

(10) Patent No.: US 7,684,257 B1
(45) Date of Patent: Mar. 23, 2010

(54) AREA EFFICIENT AND FAST STATIC RANDOM ACCESS MEMORY CIRCUIT AND METHOD

(75) Inventors: Christopher Lee, Monte Sereno, CA (US); Thinh Tran, Palo Alto, CA (US); Joseph Tzou, Mountain View, CA (US); Morgan Whately, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/958,215

(22) Filed: Dec. 17, 2007

Related U.S. Application Data (60) Provisional application No. 60/874,993, filed on Dec. 15, 2006.

(51) Int. Cl.
 *G11C 7/00* (2006.01)
 *G11C 7/10* (2006.01)
(52) U.S. Cl. .......................... 365/189.011; 365/189.08
(58) Field of Classification Search ........... 365/189.011
 See application file for complete search history.

(56) References Cited

U.S. PATENT DOCUMENTS

| 5,001,665 | A | * | 3/1991 | Gergen et al. | 711/207 |
| 5,598,545 | A | * | 1/1997 | Childers et al. | 712/221 |
| 5,996,052 | A | * | 11/1999 | Taniguchi et al. | 711/155 |
| 6,047,366 | A | * | 4/2000 | Ohara et al. | 712/14 |
| 7,277,820 | B2 | * | 10/2007 | Johnstone et al. | 702/180 |
| 7,366,049 | B2 | * | 4/2008 | Johnstone | 365/230.05 |

* cited by examiner

*Primary Examiner*—Son L Mai (57) ABSTRACT

Disclosed is an accumulation memory circuit for providing a fast read, modify, and write operation in a single clock cycle time. The memory circuit is configured to read data stored in the memory device at an address. The memory circuit includes a reconfigurable adder unit generating read, accumulate and write output in a single clock cycle. The memory circuit is further configured to minimize data overflow. A high speed accumulation method comprises resetting a memory circuit; reading from an address of the memory circuit; performing internal addition within the memory circuit and rewriting into the address of the memory circuit in a single clock cycle.

13 Claims, 6 Drawing Sheets

AREA EFFICIENT AND FAST STATIC RANDOM ACCESS MEMORY CIRCUIT AND METHOD

This application claims priority under 35 U.S.C. §119(e) to U.S. Provisional Application No. 60/874,993, filed on Dec. 15, 2006, the entire contents of which are hereby incorporated by reference herein.

BACKGROUND

1. Field of the Invention

The present invention relates to semiconductor memory devices. More particularly, the present invention relates to an efficient and a fast SRAM circuit and method providing for read, modify, and write operations in a single clock cycle time.

2. Background Information

A conventional Static Random Access Memory (SRAM) is a form of electronic data storage which retains data as long as power is supplied. Random access means that locations in the memory can be written to or read from in any order, regardless of the memory location that was last accessed. SRAM memory is widely utilized in electronic devices, and is particularly well-suited for use in portable or hand-held applications where low power consumption is required. SRAM memory is also used in high performance applications such as microprocessor caching since the SRAM can provide fast access times while not requiring the cell data refresh operations (as required in a Dynamic Random Access Memory).

Figure 1:
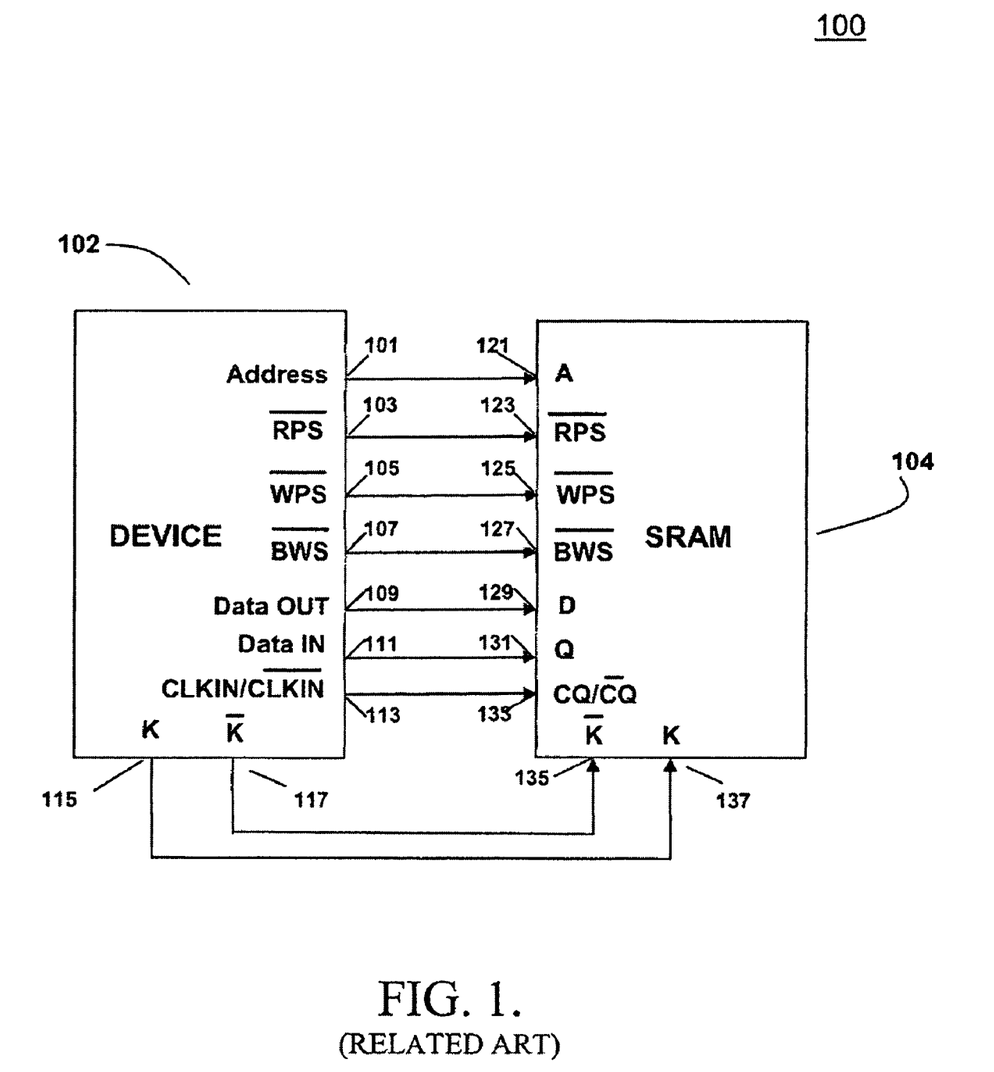
FIG. 1 illustrates a circuit diagram of a conventional system comprising an SRAM circuit.

FIG. 1 illustrates a conventional system 100 for implementing testing in memory devices, wherein the conventional system comprises SRAM and an external adder performing read, modify, and write operations while utilizing multiple clock cycle times. The conventional system 100 comprises a static random access memory (SRAM) block 104 coupled to an application specific integrated circuit (ASIC) block 102, wherein the read operations are initiated by asserting Read port select bar (RPSb) and write operations are initiated by asserting Write port select bar (WPSb). A RPSb port 123 of the SRAM block 104 is coupled to an RPSb port 103 of the ASIC block 102, a WPSb port 125 of the SRAM block 104 is coupled to a WPSb port 105 of the ASIC block 102. A Byte write select bar (BWSb) port 127 of the SRAM block 104 is coupled to a BWSb port 107 of the ASIC block 102. An address input pin (A) 121 of the SRAM block 104 is coupled to an address input pin 101 of the ASIC block 102. The Data OUT pin 109 and Data IN pin 111 of the ASIC block 102 are coupled to the D pin 129 and the Q pin 131 of the SRAM block 104, respectively. A positive input clock signal (K) 115 and a negative input clock signal Kbar 117 (also be referred to as Kb) of the ASIC block 102 are coupled to the positive input clock signal (K) 137 and the negative input clock signal (Kb) 135 of the SRAM block 104. A clock input signal (CQ/CQbar) 133 of the SRAM block 104 are coupled to a clock input signal (CLKIN/CLKINb) 113 of the ASIC block 102.

Figure 2:
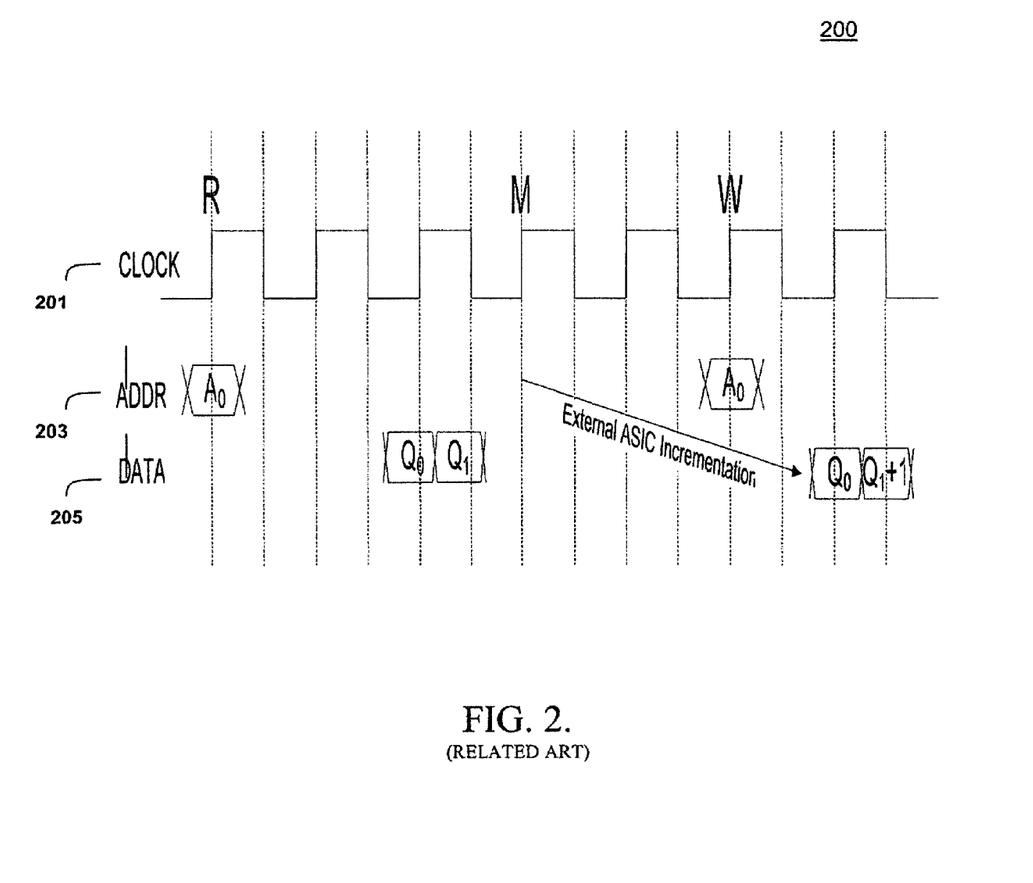
FIG. 2 illustrates a timing diagram of the conventional SRAM system.

Referring to FIG. 2, a timing diagram 200 illustrates all operation of the conventional system 100. Waveform 201 shows a clock cycle comprising read, modify and write sub cycles. Waveform 203 shows incremental operations of the external adder. Waveform 205 shows the incremented data, which is updated to an address in the memory.

The operational steps of the timing diagram 200 are described as follows. In a first step, the SRAM is reset. In a second step, data is read from SRAM. In a third step, data is incremented through an external adder. In a fourth step, new data is written back in to the SRAM. Thus, multiple clock sub cycles are required for performing read, modify and write operations, which is a disadvantage in the conventional system.

During the testing of circuits, such as a conventional Analog to Digital converter (ADC), the number of times a particular converter output value has been hit is detected and a SRAM circuit is used for accumulation of data from the ADC circuit. In order to accumulate data in the SRAM circuit, first the previous accumulated data is read from the SRAM, and then data is incremented by one externally, and then rewritten back into the SRAM circuit to the same address location.

A disadvantage of the conventional method is that the SRAM block 104 cannot perform increment or decrement operations internally, hence the increment and decrement operations are done externally by the ASIC block 102. The process requires read, write and modify operations to complete one increment operation, which requires multiple clock cycles, thereby increasing the testing time. Another disadvantage of conventional method is that an extra circuit and an extra SRAM is required for overflow protection, thereby adding to die area and adding to the power consumption.

It would be desirable to provide an improved circuit providing a fast and efficient SRAM circuit with no additional circuit for overflow protection, thus performing the read, modify and write operations in a single clock cycle time.

SUMMARY OF THE INVENTION

An area efficient and fast static random access memory circuit and method are disclosed. In accordance with exemplary embodiments of the present invention, according to a first aspect of the present invention, a circuit includes a memory unit, wherein the memory unit includes a plurality of storage matrices further including an accumulation device. The circuit includes a logic unit, wherein the logic unit comprises a register unit coupled to each storage matrix of the memory unit in a single cycle read, modify and write configuration.

According to the first aspect, the accumulation device comprises a reconfigurable adder circuit performing read, modify and write operations in a single clock cycle. For example, a data accumulated through the accumulation device represents the number of times a sample data has occurred during testing of a device under test. The accumulation device increments the data by one in an address location received by the memory unit, and wherein the memory unit is configured to rewrite the data to the same address location. The logic unit comprises an Application Specific Integrated Circuit (ASIC) device. According to an exemplary embodiment, the memory unit comprises a plurality of overflow address locations, and wherein a byte write select input port (BWSb) is configured to provide overflow addresses according to different memory configurations chosen by the user.

According to a second aspect of the present invention, a circuit includes a memory device, wherein the memory device is configured to read data stored in the memory device at an address. The memory device comprises an adder unit, wherein the adder unit is configured to accumulate the data to generate accumulated data, wherein the memory device is configured to write the accumulated data to the address, and wherein the read, increment, and write are performed in one clock cycle.

According to the second aspect, the memory device is configured to receive an address location for reading the stored data. The memory device is configurable to provide an accumulation mode. A user configures the memory device to accumulate and store reoccurring data from devices under test. According to an exemplary embodiment of the invention, the memory device comprises a byte write select input port (BWSb), and wherein a user configures the memory device for different memory configurations via the BWSb. The BWSb is configured to provide overflow addresses in accordance with different memory configurations chosen by the user. For example, the memory device comprises a static random access memory (SRAM). However, the exemplary embodiments of the invention are not limited to a SRAM.

According to a third aspect of the present invention, a method of recording an occurrence of sampled data in a device under test, includes steps of: (a) reading data stored in a memory unit at an address; (b) modifying the data to generate accumulated data, wherein step (b) is performed internally to the memory unit; and writing the incremented data to the address, wherein steps (a), (b), and (c) are performed in no more than a single clock cycle.

According to the third aspect, the method comprises steps of receiving at the memory unit an address input signal, wherein the address input signal comprises an address location of data representing a number of times the sample data has occurred. The method comprises steps of providing overflow protection using a plurality of overflow address locations, wherein the overflow address locations are configured to store overflow data. According to an example, prior to step (a), the method comprises the steps of: enabling a global reset signal; and resetting the memory unit to a predetermined value. The method comprising the step of reconfiguring the memory unit for different memory configurations.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to an efficient and a fast static random access memory circuit and method. The improved circuit provides fast read, write and modify operations in a single clock cycle time, which can be used for a fast and efficient testing methodology. However, the present invention is not restricted to a static random access memory. In an embodiment of the invention, the improved system comprises a memory unit, wherein the memory unit comprises a plurality of storage matrices further comprising an accumulation device; and a logic unit, wherein the logic unit comprises a register unit coupled to each storage matrix of the memory unit in a single cycle read, modify and write configuration. The accumulation device comprises a reconfigurable adder circuit performing read, modify and write operations in a single clock cycle. The improved system provides data overflow protection with no additional requirement for external adders and extra SRAM circuits.

An embodiment of the invention relates to an accumulation memory circuit, which comprises a memory unit further comprising a plurality of storage matrices. A logic unit further comprising a register unit coupled to each storage matrix of the memory unit in a single cycle read, modify and write configuration. The memory unit comprises an accumulation memory device. The accumulation memory device is configured to accumulate data, wherein the data represents the number of times a sample data has occurred during a testing of a circuit. The accumulation memory device increments the data by one in an address location provided by the device via an address input port (A) and rewrites the data in the same address location.

In the accumulation memory circuit, a read enable input; a write enable input; a byte write select input; an address input; a clock input; a clock input bar; a synchronous clock output; and a synchronous clock output bar of both the memory unit and the logic unit are coupled. The logic unit comprises an Application Specific Integrated Circuit (ASIC) device. The memory unit comprises a plurality of overflow address locations, wherein a byte write select input port (BWSb) provides overflow addresses according to different memory configurations chosen by the user.

An embodiment of the invention relates to an area efficient and fast SRAM system comprising a device and a SRAM system coupled to the device. The SRAM circuit and the device are configured to provide a fast read, write and modify operation utilizing a single clock cycle time. Both the SRAM circuit and the device are configured to provide overflow protection. The system provides user configurable device options such as selection of an accumulation mode, the user is provided with the option to select the SRAM to accumulate and keep track of reoccurring data from other circuits. The system is preferably used in testing of circuits to keep track of reoccurring data during testing. The SRAM comprises a byte write select input port (BWSb), wherein a user is provided with an option to select different memory configurations. The BWSb provides overflow addresses according to different memory configurations chosen by the user.

An embodiment of the invention relates to a method for testing semiconductor devices and a method for implementing a memory circuit. The method comprises a first step of selecting an accumulation mode of a static random access memory (SRAM), the memory is configured to accumulate a sample data occurring during testing of a device. A second step is resetting the SRAM. A third step is receiving at the SRAM an address input signal from the device, wherein the address input signal represents an address location of data representing a number of times the sample data has occurred. A fourth step is reading the status of the SRAM circuit. A fifth step is incrementing the data in the SRAM circuit. A sixth step is rewriting the data back into its original memory location. A seventh step is providing a system having a configurable accumulation mode, and configurable SRAM memory configurations. An eighth step is providing a fast read, write and modify operation in a single clock cycle time.

In an embodiment of the invention the method comprises providing overflow protection by providing a plurality of overflow address locations, the overflow address locations stores overflow data.

In an embodiment of the invention a method for implementing an accumulation memory circuit comprises a first step of enabling a global reset signal. A second step is resetting the accumulation memory circuit to zero. A third step is reading from an address, accumulating and rewriting when a sampled data hits on a design under test. A single clock cycle is used to accumulate reoccurrence of sampled data.

Figure 3:
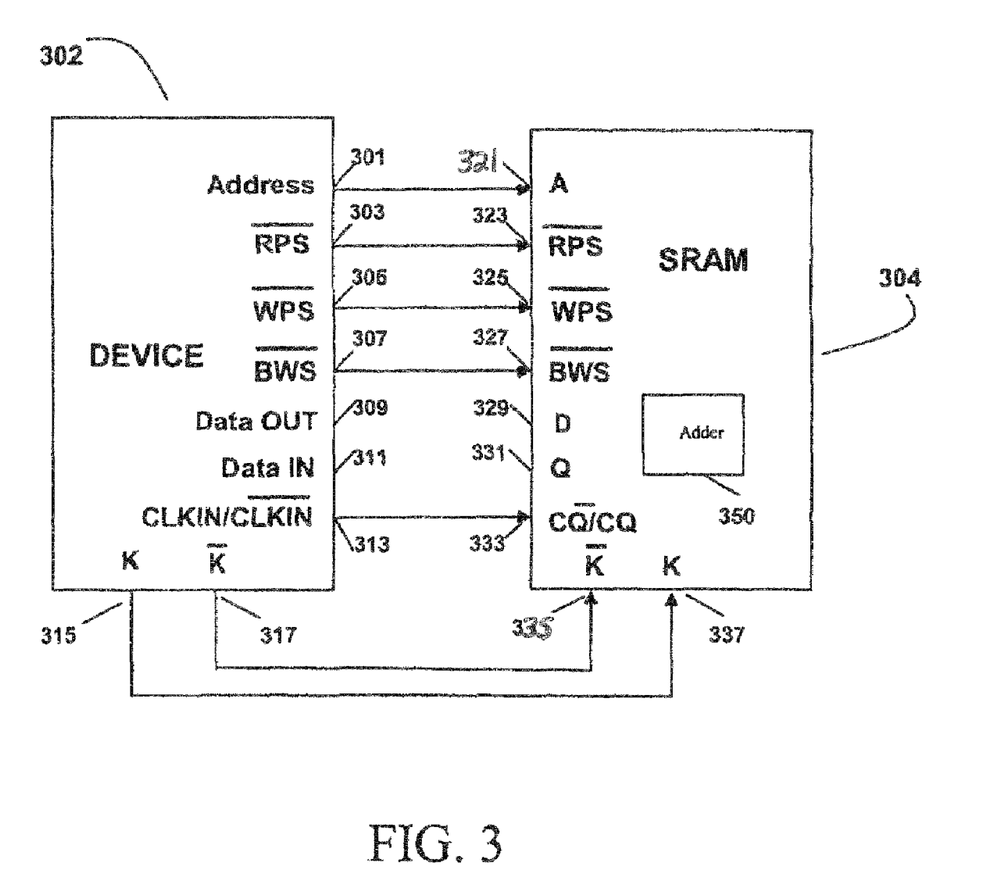
FIG. 3 is a circuit diagram illustrating an improved circuit for SRAM performing read, write and modify operations utilizing one clock cycle, in accordance with an exemplary embodiment of the present invention.

These and other aspects and embodiments of the present invention will now be described in greater detail. FIG. 3 illustrates an accumulation memory circuit 300 for fast read, modify and write operations all performed in a single clock cycle time. The circuit 300 comprises SRAM circuit 304. The SRAM 304 is configured to provide fast read, modify, and write operations in a single clock cycle time through the use of an internal accumulator or adder circuit 350. The SRAM circuit 304 can be configured to provide overflow protection, wherein extra bits or addresses are provided to store the overflow data, as discussed in more detail below. According to an exemplary embodiment, the device 302 comprises a suitable logic device, such as an ASIC or the like, which is under a test operation. Merely for purposes of illustration and not limitation, the circuit 304 is described as a SRAM. However, those of ordinary skill in the art will recognize that the circuit 304 can comprise any suitable type of memory.

The SRAM circuit 304 comprises a read enable input (RPSb) 323, a write enable input WPSb 325 (can also be referred to as WPS bar), a byte write select input (BWSb) 327, an address input (A) 321, a data input port (D) 329, a data output port (Q) 331, a positive clock input (K) 337, a negative clock input (Kb) 335, a synchronous clock output (CQ) and a negative synchronous clock output (CQb) 333. The SRAM circuit 304 is coupled to a device 302 wherein the read enable input (RPSb) 323 of the SRAM circuit 304 is coupled to a read enable input (RPSb) 303 of ASIC 302 and the write enable input (WPSb) 325 of the SRAM 304 is coupled to a write enable input (WPSb) 305 of the device 302. The byte write select input (BWSb) 327 of the SRAM 304 is coupled to a byte write select input (BWSb) 307 of the device 302. The address input (A) 321 of the SRAM 304 is coupled to an address input (A) 301 of the device 302. The positive clock input (K) 337 of the SRAM 304 is coupled to a positive clock input (K) 317 of the device 302. A negative clock input (Kb) 335 of the SRAM 304 is coupled to a negative clock input (Kb) 315 of the device 302. The synchronous clock output (CQ) and a negative synchronous clock output (CQb) 333 of the SRAM 304 is coupled to a synchronous clock output (CQ) and a negative synchronous clock output (CQb) 313 of the device 302.

The read port or the read enable input (RPSb) 323 of the SRAM circuit 304 is dedicated to read operations. The write port of the write enable input (WPSb) 325 of the SRAM circuit 304 is dedicated to write operations. The data flows into the SRAM circuit 304 through the write enable input (WPSb) 325 and the data flows out of the SRAM circuit 304 through the read enable input (RPSb) 323. Accesses for the read enable input (RPSb) 323 and the write enable input (WPSb) 325 are initiated by the positive clock input (K) 337. The byte write select input (BWSb) 327 of the SRAM circuit 304 determines the bytes that are to be written during the write operation.

The synchronous data inputs (D) 329 and the synchronous data outputs (Q) 331 are controlled by the positive clock input (K) 337 and the negative clock input (Kb) 335 of the SRAM circuit 304. The synchronous controls such as the read enable input (RPSb) 323, the write enable input (WPSb) 325 and the byte write select input (BWSb) 327 are controlled by the positive clock input(K) 337 and the negative clock input (Kb) 335. The address inputs (A) 321 of the SRAM circuit 304 indicate the address location which is accessed during both the read operations and the write operations.

During the testing of circuits, such as an Analog-to-Digital converter (ADC) or other like circuits, accumulating the reoccurrence of a sampled data is required. According to an exemplary embodiment of the present invention, the SRAM circuit 304 can be utilized to store the sampled data and to keep track of the number of times the sampled data has reoccurred. In particular, the SRAM circuit 304 can be configured to accumulate the data using the internal adder circuit 350, wherein the data represents the number of times a sampled data has reoccurred during the testing of the circuit. The circuit 300 is user configurable, wherein the user can select an accumulation mode where the SRAM 304 is coupled to a programmable logic device in accordance with an exemplary embodiment of the present invention. The programmable logic device is operable by a user. The sampled data can be stored in the SRAM 304 during this operation. During the accumulation mode, the SRAM circuit 304 receives an address input signal from the device 302 via the address input (A) 321, wherein the address input (A) 321 indicates the address that holds the count (incrementing by one in accordance with an exemplary embodiment of the invention) of the number of reoccurrences during testing. The contents of the address input (A) 321 are then incremented. In other words, using the internal adder circuit 350, the SRAM circuit 304 increments (or decrements) the data by one (or other suitable predetermined value) in the address location provided by the device 302 via the address input (A) 321, and rewrites the data to the same address location, thereby performing read, modify, and write operations in no more than a single clock cycle time. Thus, the device 302 or other suitable circuit can provide the address location, while the increment operation is performed internally within the SRAM circuit 304 via the adder circuit 350.

According to an additional exemplary embodiment, the SRAM circuit 304 can also be configured to provide overflow protection. A plurality of overflow addresses can be provided to handle overflow during testing, and the circuit 300 can be configured to detect the overflow addresses automatically. For purposes of illustration and not limitation, a 24 bit ADC can be tested, and an SRAM circuit 304 with, for example, 2Mx36 memory configuration can be utilized. The 24 bit ADC requires $2^{24}$ addresses and the memory configuration 2Mx36 provides $2^{21}$ addresses, thereby resulting in overflow of data. The SRAM circuit 304 comprises a plurality of overflow address locations, wherein the byte write select input ports (BWSb) 327 provides the overflow addresses. The BWSb port 327 is used as an address port providing a plurality of memory matrix configurations, wherein the user can reconfigure the SRAM circuit 304 from 1Mx72 to other memory configurations, such as, for example, 2Mx36, 4Mx18, 8Mx9 or the like. For example, the memory configuration 2Mx36 requires $2^{21}$ addresses with each address holding a 36-bit word. Similarly, the memory configuration 4Mx18 requires $2^{22}$ addresses with each address holding an 18-bit word. Thus, the system provides an effective utilization of the memory of the SRAM circuit 304.

An advantage of the embodiment shown by the circuit 300 is that the SRAM circuit 304 performs read, modify, and write operations in a single clock cycle time, thereby reducing the testing time. Another advantage of the circuit 300 is that the SRAM circuit 304 performs increment and decrement function internally without any additional requirement for external adders.

Another advantage of the circuit 300 is that the SRAM circuit 304 provides overflow protection without any additional requirement for extra SRAM circuits, thereby providing a negligible increase in die area and lesser power consumption. Another advantage of the circuit 300 is that it is user configurable and provides adjustable device options to suit customer needs. The circuit 300 is used for easy and fast data storage and is a minimal power consumption circuit. For example, the circuit 300 can be used by testing companies or the like for data storage during testing of circuits. Other applications of exemplary embodiments of the present invention include, for example, network traffic tracking and the like.

Figure 4:
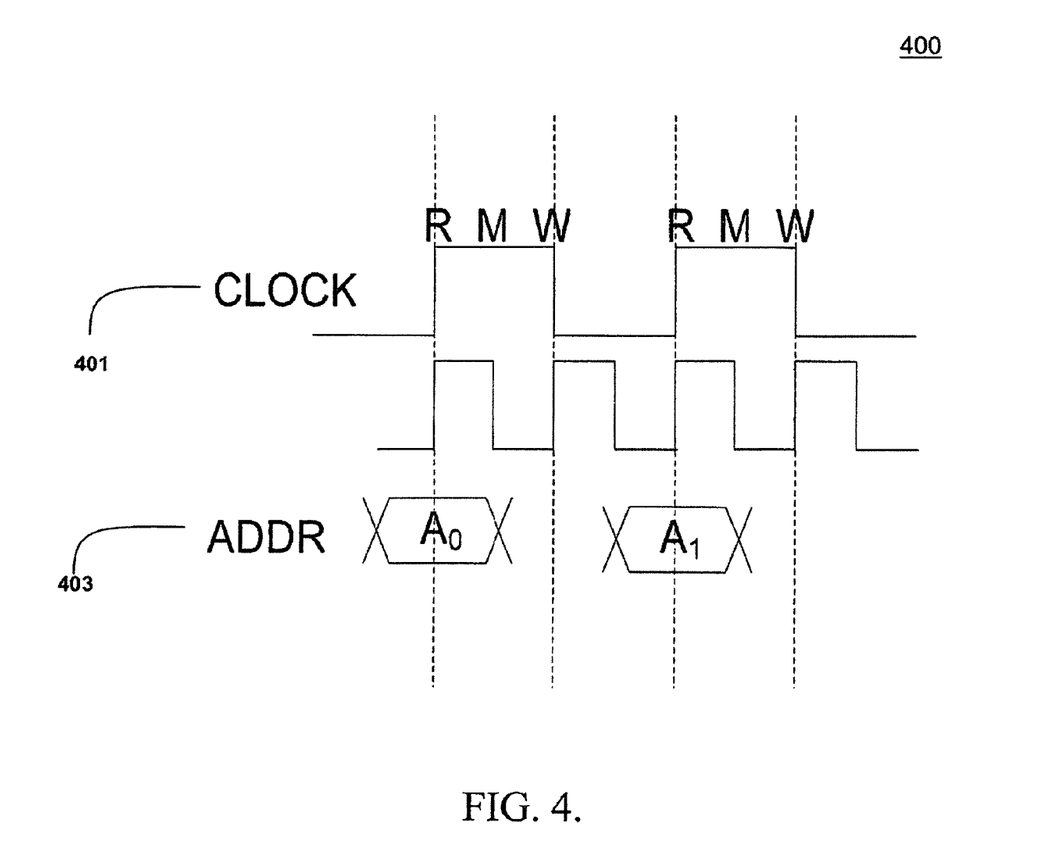
FIG. 4 is a circuit diagram illustrating a timing diagram for the improved circuit of FIG. 3, in accordance with an exemplary embodiment of the present invention.

Referring to FIG. 4, illustrates a timing diagram 400 depicting operational features of the circuit 300. In the circuit 300, read, modify, and write operations are performed within a single clock cycle time. The address input signals 403 comprise an address location Ao. A clock input signal 401 comprises a first clock cycle and all three read, modify, and write operations are performed in a single clock cycle time. The address location Ao is provided in the address input signal (e.g., by the device 302) and indicates the address of the data that has reoccurred during testing. According to exemplary embodiments, the contents of the address location Ao in the SRAM circuit 304 are incremented (or decremented) by the adder circuit 350. In other words, the SRAM circuit 304 accumulates the data by one (or other suitable predetermined value) in the address location using the adder circuit 350, and rewrites the data to the same address location Ao, thereby performing read, modify, and write operations in a single clock cycle time.

Figure 5:
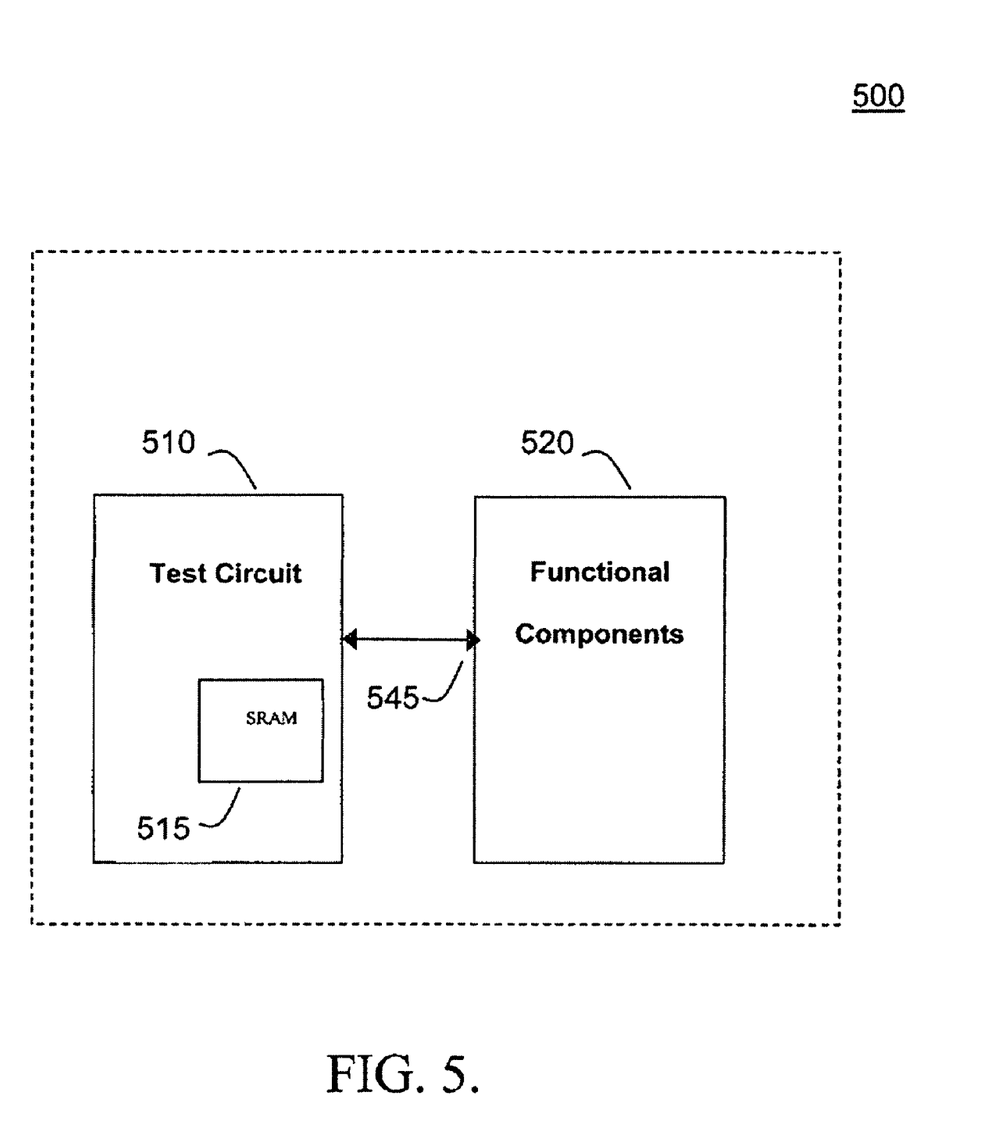
FIG. 5 is a diagram illustrating a system with the improved circuit according to an embodiment of the present invention.

The present invention further comprises an exemplary embodiment depicting a system 500, for example a processor, a chip or the like, comprising the testing circuit 510 as illustrated in FIG. 5. The system 500 comprising the testing circuit 510 further includes a SRAM circuit 515. The testing circuit 510 is further coupled to a device under test 520 (an ASIC according to an exemplary embodiment of the invention) via connectors 545. The connectors 545 include suitable wired or wireless means for connecting the functional components of the device under test 520 to the testing circuit 510. As the SRAM circuit includes a reconfigurable adder or other accumulation circuit, the testing circuit 510 provides fast read, modify, and write operations in a single clock cycle time. The output signal from the testing circuit 510 can then be provided to the functional components of the device under test 520. The functional components are ADC's (Analog to Digital converter circuits) in accordance with exemplary embodiments of the invention.

Figure 6:
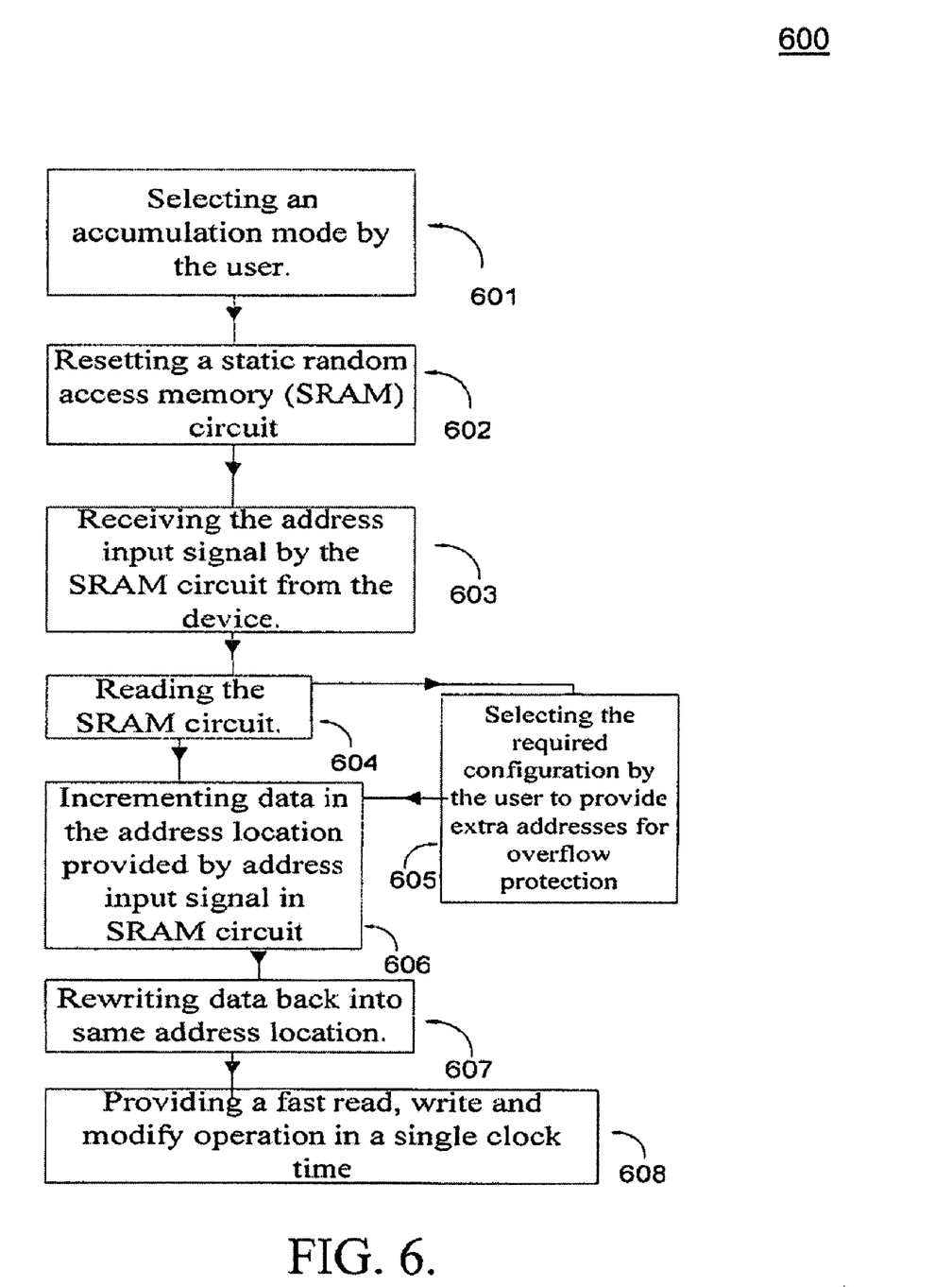
FIG. 6 is a flow chart illustrating a method for providing a fast read, write and modify operations in a single clock cycle time according to an embodiment of the present invention.

The present invention further comprises a method for implementing a SRAM circuit for providing read, modify, and write operations in a single clock cycle time. FIG. 6 is a flow chart illustrating a method 600 for providing a fast and area-efficient read, modify, and write operation for a memory circuit in a single clock cycle time. A first step 601 comprises selecting an accumulation mode by the user, wherein a SRAM circuit is used to accumulate a sample data that reoccurs during testing. As discussed previously, the SRAM circuit includes a suitable internal adder or accumulation circuit for incrementing or decrementing a count of the times the sampled data has reoccurred. A second step 602 comprises resetting the SRAM circuit, which is coupled to a device. The SRAM circuit can be reset to any suitable predetermined value, such as zero. A third step 603 comprises sending an address by an external device to the SRAM circuit. The address is the location in the memory of the SRAM circuit that stores the data representing the number of times the sample data has reoccurred. A fourth step 604 comprises reading of the SRAM circuit at the specified address. According to an additional exemplary embodiment of the present invention, an optional fifth step 605 comprises providing a plurality of overflow address locations in case of an overflow, wherein the overflow address locations store the overflow data. A sixth step 606 comprises incrementing the data in the SRAM circuit by one (although the data can also be decremented, depending on the requirements of the test or other like factors). A seventh step 607 comprises rewriting the data back into the same address location in the SRAM circuit. In such a user configurable system, the user has the option of selecting the accumulation mode and an option to select various memory configurations for the SRAM circuit. An eighth step 608 comprises providing the read, modify, and write operations in a single clock cycle time.

In accordance with an exemplary embodiment of the present invention, a global reset signal resets a memory circuit to zero, wherein the memory circuit is connected to a DUT (Design Under Test) circuit. If a testing data (can be referred to as sample data) hits the DUT, the read, accumulate (modify) and write operation is performed in the memory circuit. A reconfigurable adder circuit in built in the memory circuit, which accumulates (counts) a number of times a predetermined address is hit, the predetermined address further including a sample verification/testing data. The accumulation is done in the memory circuit.

Embodiments of the present invention are well suited to performing various other steps or variations of the steps recited herein, and in a sequence other than that depicted and/or described herein. In one embodiment, such a process can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Details of the circuit comprising an improved accumulation memory circuit providing a fast read, modify, and write operation in a single clock cycle time, and the method of achieving same that are widely known and not relevant to the present discussion have been omitted from the present description for purposes of clarity and brevity.

It should be appreciated that reference throughout the present specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics can be combined as suitable in one or more exemplary embodiments of the present invention.

Similarly, it should be appreciated that in the foregoing discussion of exemplary embodiments of the invention, various features of the present invention are sometimes grouped together in a single embodiment, figure, or description thereof for the purpose of streamlining the disclosure to aid in the understanding of one or more of the various inventive aspects. Such a method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A circuit comprising:
   a memory unit, wherein the memory unit comprises a plurality of storage matrices further comprising an accumulation device; and
   a logic unit, wherein the logic unit comprises a register unit coupled to each storage matrix of the memory unit in a single cycle read, modify and write configuration,
   wherein the accumulation device comprises a reconfigurable adder circuit performing read, modify and write operations in a single clock cycle,
   wherein a data accumulated through the accumulation device represents the number of times a sample data has occurred during testing of a device under test.

2. The circuit of claim 1, wherein the accumulation device increments the data by one in an address location received by the memory unit, and wherein the memory unit is configured to rewrite the data to the same address location.

3. The circuit of claim 1,
   wherein the logic unit comprises an Application Specific Integrated Circuit (ASIC) device.

4. A circuit comprising:
   a memory unit, wherein the memory unit comprises a plurality of storage matrices further comprising an accumulation device; and
   a unit, wherein the logic unit comprises a register unit coupled to each storage matrix of the memory unit in a single cycle read, modify and write configuration,
   wherein the memory unit comprises a plurality of overflow address locations, and
   wherein a byte write select input port (BWSb) is configured to provide overflow addresses according to different memory configurations chosen by the user.

5. A circuit, comprising:
   a memory device,
      wherein the memory device is configured to read data stored in the memory device at an address,
      wherein the memory device comprises:
         an adder unit, wherein the adder unit is configured to accumulate the data to generate accumulated data, wherein the memory device is configured to write the accumulated data to the address, and wherein the read, accumulate, and write are performed in one clock cycle,
      wherein the memory device is configurable to provide an accumulation mode,
      wherein a user configures the memory device to accumulate and store reoccurring data from devices under test.

6. The circuit of claim 5, wherein the memory device comprises a byte write select input port (BWSb), and
   wherein a user configures the memory device for different memory configurations via the BWSb.

7. The circuit of claim 6, wherein the BWSb is configured to provide overflow addresses in accordance with different memory configurations chosen by the user.

8. The circuit of claim 5, wherein the memory device comprises a static random access memory (SRAM).

9. A method of recording an occurrence of sampled data in a device under test, comprising the steps of:
   (a) reading data stored in a memory unit at an address;
   (b) modifying the data to generate accumulated data, wherein step (b) is performed internally to the memory unit; and
   (c) writing the incremented data to the address, wherein steps (a), (b), and (c) are performed in no more than a single clock cycle.

10. The method of claim 9, comprising the steps of:
    receiving at the memory unit an address input signal,
       wherein the address input signal comprises an address location of data representing a number of times the sample data has occurred.

11. The method of claim 9, comprising the step of:
    providing overflow protection using a plurality of overflow address locations,
       wherein the overflow address locations are configured to store overflow data.

12. The method of claim 9, wherein prior to step (a), the method comprises the steps of:
    enabling a global reset signal; and
    resetting the memory unit to a predetermined value.

13. The method of claim 9, comprising the step of:
    reconfiguring the memory unit for different memory configurations.

* * * * *